(12) United States Patent
Kim et al.

(10) Patent No.: US 8,228,132 B2
(45) Date of Patent: Jul. 24, 2012

(54) VOLTAGE-CONTROLLED OSCILLATOR ROBUST AGAINST POWER NOISE AND COMMUNICATION APPARATUS USING THE SAME

(75) Inventors: Young-Ho Kim, Daejeon (KR); Je-Hoon Yun, Daejeon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 0 days.

(21) Appl. No.: 12/779,145

(22) Filed: May 13, 2010

(65) Prior Publication Data

US 2010/0295626 A1    Nov. 25, 2010

(30) Foreign Application Priority Data

May 19, 2009    (KR) .................. 10-2009-0043611

(51) Int. Cl.
*H03L 1/00*    (2006.01)
(52) U.S. Cl. ............. 331/186; 331/57; 331/117 FE
(58) Field of Classification Search .......... 331/57, 331/117 FE, 185, 186
See application file for complete search history.

(56) References Cited

U.S. PATENT DOCUMENTS

| | | | |
|---|---|---|---|
| 5,604,466 A * | 2/1997 | Dreps et al. ............. | 331/113 R |
| 5,945,883 A * | 8/1999 | Nagasawa et al. ......... | 331/57 |
| 6,566,970 B2 * | 5/2003 | Ingino, Jr. ............. | 331/57 |
| 6,731,182 B2 * | 5/2004 | Sakurai ............... | 331/177 V |
| 7,336,138 B2 * | 2/2008 | Kitamura et al. ......... | 331/186 |
| 7,535,308 B2 | 5/2009 | Shin et al. | |
| 2002/0039051 A1 * | 4/2002 | Ito et al. ............ | 331/25 |
| 2008/0157889 A1 | 7/2008 | Yu | |

FOREIGN PATENT DOCUMENTS

| | | |
|---|---|---|
| KR | 10-0715483 B1 | 4/2007 |
| KR | 10-0818798 B1 | 3/2008 |
| KR | 10-0836147 B1 | 6/2008 |

OTHER PUBLICATIONS

Chih-Chien Hung et al., "A Sub-1V CMOS 2.5Gb/s Serial Link Transceiver Using 2X Oversampling", ASSCC2005, pp. 37-40.
Frank O'Mahony et al., "A Low-Jitter PLL and Repeaterless Clock Distribution Network for a 20Gb/s Link", 2006 Symposium on VLSI Circuits Digest of Technical Papers.

\* cited by examiner

*Primary Examiner* — Levi Gannon
(74) *Attorney, Agent, or Firm* — Rabin & Berdo, P.C.

(57) ABSTRACT

A voltage-controlled oscillator robust against power supply includes: a regulating unit configured to maintain a virtual power supply of a VCO core circuit in a stable condition with regard to a reference voltage; and a power supply removal unit including second transistors configured to correspond to respective first transistors of the regulating unit, the power supply removal unit being configured to remove power noise of the virtual power supply by using negative feedback through a closed-circuit loop formed by each of the first and second transistors.

12 Claims, 8 Drawing Sheets

VOLTAGE-CONTROLLED OSCILLATOR ROBUST AGAINST POWER NOISE AND COMMUNICATION APPARATUS USING THE SAME

CROSS-REFERENCE(S) TO RELATED APPLICATIONS

The present application claims priority of Korean Patent Application No. 10-2009-0043611 filed on May 19, 2009, which is incorporated herein by reference in its entirety.

BACKGROUND OF THE INVENTION

1. Field of the Invention

Exemplary embodiments of the present invention relate to a voltage-controlled oscillator robust against power noise and a communication apparatus using the same; and, more particularly, to a voltage-controlled oscillator robust against power noise, which is configured to detect noise introduced through the power supply in advance and remove the power noise through a negative feedback loop so that a stable, single oscillation frequency is provided while guaranteeing low phase noise and low jitter characteristics, and a communication apparatus using the same.

2. Description of Related Art

As generally known in the art, transceiver circuits for communication, which are manufactured as chips, tend to be adversely affected by electromagnetic interference (EMI) introduced through the power line from spurious external electromagnetic environments, or by change of temperature inside/outside the chips.

Specifically, EMI noise induced by change in the power supply voltage may have a critical influence on the voltage-controlled oscillator (VCO) within the IC, which governs the system's communication performance. This is because the frequency quality of the VCO determines the signal modulation/demodulation performance of the mixer for frequency conversion, and any increase in the phase noise or jitter of the oscillation signal is followed by increase in the error vector magnitude (EVM) or bit error rate (BER) of the entire system, eventually degrading communication performance.

As used herein, the VCO refers to a circuit configured to vary the frequency based on tuning voltage, and generally has a phase-locked loop (PLL), as illustrated in FIG. 1, to maintain a stable frequency. FIG. 1A illustrates the construction of an exemplary conventional radio receiver, and FIGS. 1B and 1C illustrate exemplary frequency characteristics of the radio receiver illustrated in FIG. 1A.

Referring to FIG. 1A, the frequency synthesizer 100 is a circuit configured to control the frequency of the VCO 110 by means of the PLL.

The VCO 110 generates an oscillation frequency $f_{vco}$, which goes through a divider 120 to become $f_{vco}/N$, and which is compared with a reference frequency $f_{ref}$ by a phase/frequency detector (PFD) 130. The reference frequency $f_{ref}$ is generated by a temperature-compensated crystal oscillator (TCXO). The PFD 130 generates a control signal corresponding to the phase/frequency difference between two frequencies to adjust the amount of charge of the charge pump 140. The charge pump 140 then sends a corresponding displacement current to the filter 150 to increase/decrease the tuning voltage $V_c$ as much as the phase/frequency different between both frequencies. The frequency of the VCO 110 is adjusted in this manner.

The above-mentioned PLL is repeated to adjust the frequency until the VCO 110 stabilizes the tuning voltage $V_c$. In other words, the VCO 110 adjusts the frequency so that the reference frequency $f_{ref}$ and the multiplied arbitrary frequency $f_{vco}/N$ become finally identical or similar. As such, the VCO 110 fixes the center frequency through the PLL. Due to characteristics of the PLL, noise is filtered through a high-pass filter about the center frequency.

However, the above-mentioned conventional VCO 110 has a problem in that, if EMI-induced noise enters its power supply from the outside, the PLL of the VCO 110 becomes less stable, as illustrated in FIG. 1B, increasing the phase noise or jitter of the oscillation frequency. Therefore, there is a dire need for a VCO which, even if power noise is introduced from the outside, can provide a stable oscillation frequency with low phase noise and low jitter characteristics, as illustrated in FIG. 1C.

SUMMARY OF THE INVENTION

An embodiment of the present invention is directed to a voltage-controlled oscillator robust against power noise, which is configured to detect noise introduced through the power supply in advance and remove the power noise through a negative feedback loop so that a stable, single oscillation frequency is provided while guaranteeing low phase noise and low jitter characteristics, and a communication apparatus using the same.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a voltage-controlled oscillator robust against power noise includes: a regulating unit configured to maintain a virtual power supply of a VCO core circuit in a stable condition with regard to a reference voltage; and a power noise removal unit including second transistors configured to correspond to respective first transistors of the regulating unit, the power noise removal unit being configured to remove power noise of the virtual power supply by using negative feedback through a closed-circuit loop formed by each of the first and second transistors.

In accordance with another embodiment of the present invention, a communication apparatus includes: a voltage-controlled oscillation unit including second transistors configured to correspond to respective first transistors of a regulator, the voltage-controlled oscillation unit being configured to provide a single frequency after removing power noise of a virtual power supply of a VCO core circuit with reference to a reference voltage by using negative feedback through a closed-circuit loop formed by each of the first and second transistors; and a mixing unit configured to conduct frequency conversion by using the single frequency.

DESCRIPTION OF SPECIFIC EMBODIMENTS

Figure 1A:
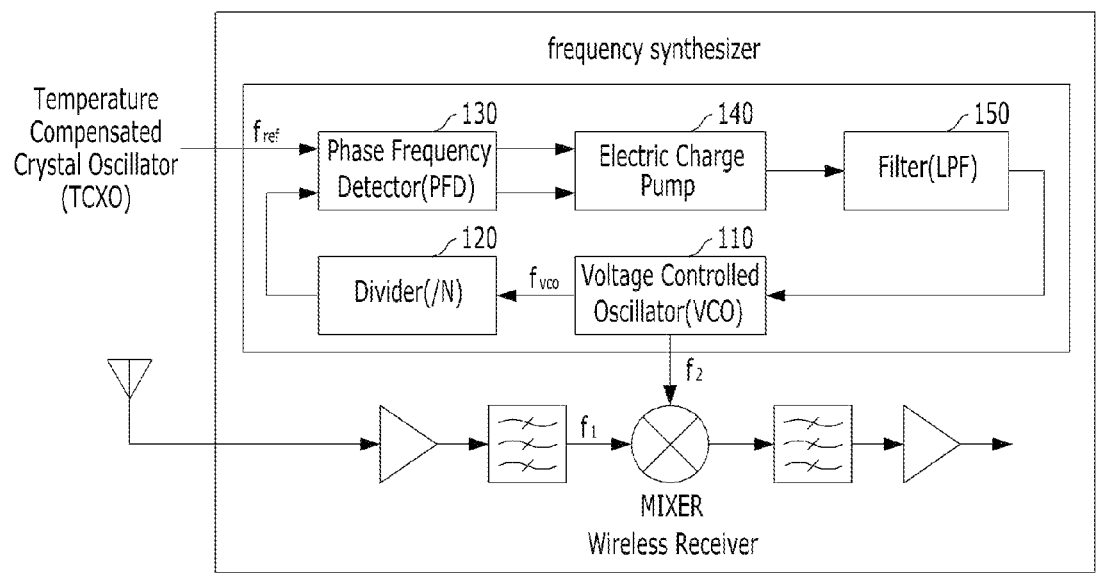
FIG. 1A illustrates a block diagram of an exemplary conventional radio receiver.
Figure 1B:
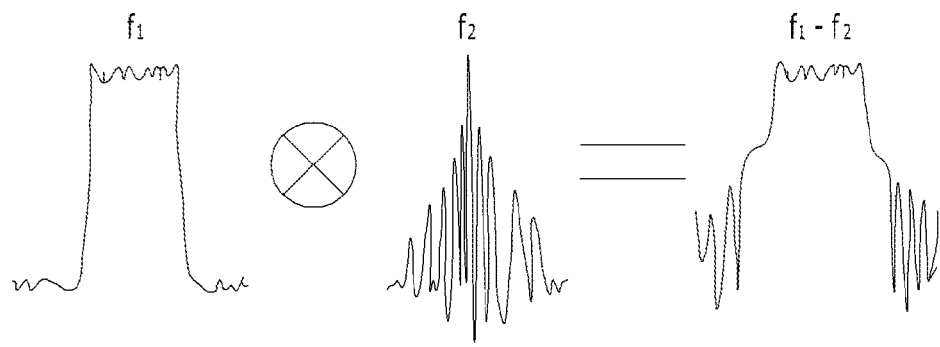
FIGS. 1B and 1C illustrate exemplary frequency characteristics of the radio receiver illustrated in FIG. 1A.
Figure 1C:
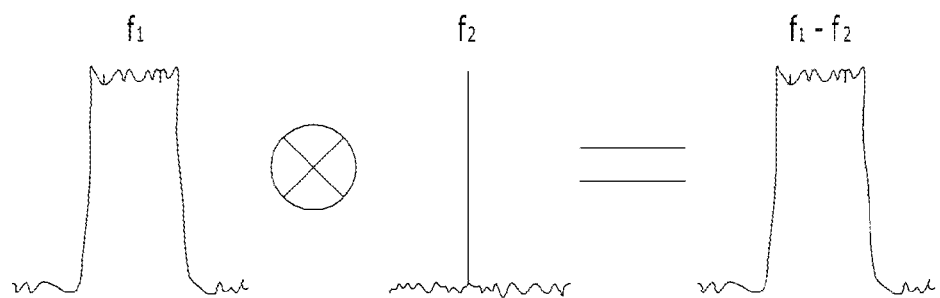

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2A:
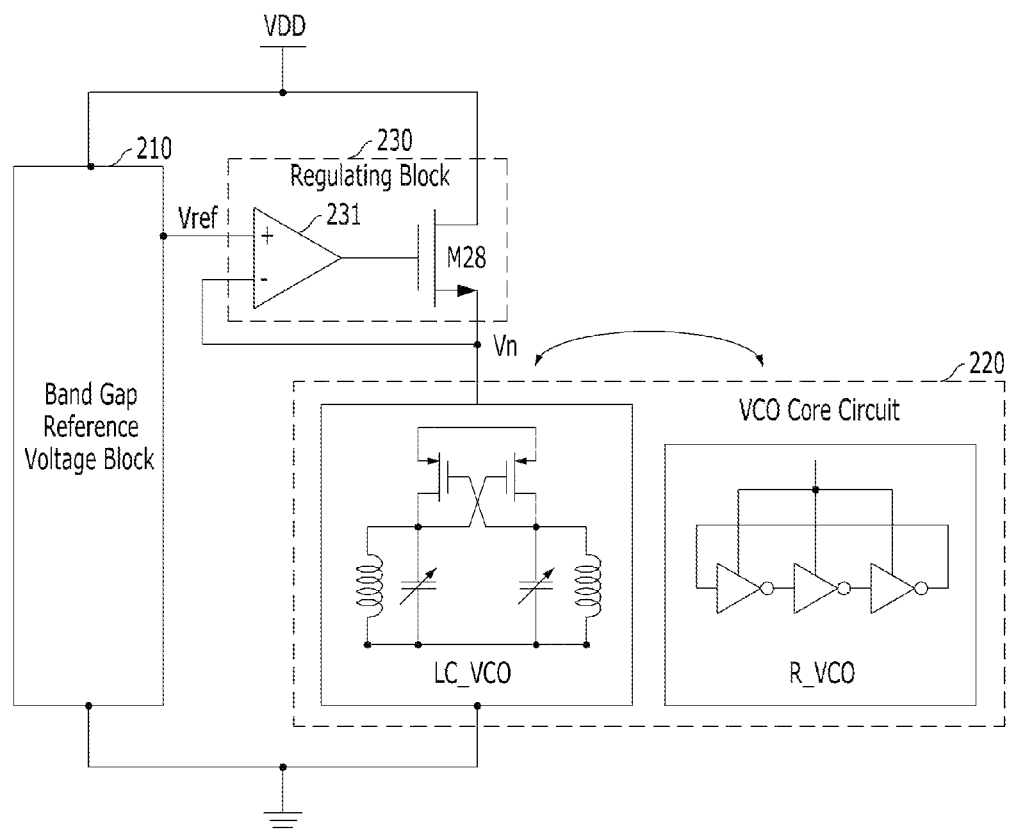
FIG. 2A illustrates a block diagram of an exemplary conventional voltage-controlled oscillator.

FIG. 2A illustrates a block diagram of an exemplary conventional VCO.

Referring to FIG. 2A, the conventional VCO includes a bandgap reference voltage unit 210, a VCO core circuit unit 220, and a regulator unit 230.

The bandgap reference voltage unit 210 generates a reference voltage $V_{ref}$ for temperature compensation.

The VCO core circuit unit 220 consists of an R-VCO, which is composed of an inverter (i.e. Ring-VCO), or an LC-RCO, which is composed of an inductor or a capacitor.

The regulator unit 230 includes a first amplifier 231 and an NMOS transistor (28$^{th}$ transistor M28, described later). The non-inverting input terminal (+) of the first amplifier 231 is connected with the bandgap reference voltage unit 210, and the inverting input terminal (−) of the first amplifier 231 is connected with the source of the NMOS transistor M28. This means that the reference voltage $V_{ref}$ is applied to the non-inverting input terminal (+) of the first amplifier 231, and the source voltage $V_n$ of the NMOS transistor M28 is applied to the non-inverting input terminal (−) of the first amplifier 231. The source voltage $V_n$ of the NMOS transistor M28 is ideally kept the same as the reference voltage $V_{ref}$. This is because the source of the NMOS transistor M28 is subjected to negative feedback. The source voltage $V_n$ of the NMOS transistor M28 corresponds to a virtual power supply for the R-VCO or LC-VCO of the VCO core circuit unit 220.

The source voltage $V_n$ of the NMOS transistor M28 exhibits the same temperature characteristics as the reference voltage $V_{ref}$, i.e. it is constant regardless of temperature change (described later with reference to FIG. 4A). Specifically, the source voltage $V_n$ of the NMOS transistor M28 is expressed in terms of the reference voltage $V_{ref}$ as follows:

$$V_n = \frac{1}{1 + \frac{g_m + g_{mb}}{A \cdot g_m} + \frac{1}{A \cdot R_{VCO} \cdot g_m}} \cdot V_{ref} \quad \text{Eq. 1}$$

wherein, A refers to the gain of the first amplifier 231 (assuming no temperature change); $g_m + g_{mb}$ refers to the transconductance value of the NMOS transistor M28 with the body effect considered; and $R_{VCO}$ refers to the impedance of the VCO. In Equation 1, parameters affected by temperature are $R_{VCO}$ and $g_{mb}$, which are small enough to be neglected when compared with A and $g_m$. This means that the source voltage $V_n$ of the NMOS transistor M28 eventually follows the temperature characteristics of the reference voltage $V_{ref}$.

Considering this, this embodiment of the present invention employs a deep n-well process to remove the body effect of the NMOS transistor M28. Specifically, the NMOS transistor M28 is formed over a p-well to connect the body to the source. Thus, the present invention makes it unnecessary to consider parameter $g_{mb}$. The 29$^{th}$ transistor M29 (described later with reference to FIG. 3) is also similarly based on the deep n-well process to connect the body to the source.

To be specific, the source voltage $V_n$ of the NMOS transistor M28 is influenced by power noise introduced through the power supply voltage $V_{DD}$, and the extent of influence depends on the degree of power supply sensitivity to the output of the first amplifier 231 at the gate of the NMOS transistor M28. In other words, the source voltage $V_n$ of the NMOS transistor M28 is not directly influenced by the drain voltage, which is in direct connection with the power supply, but is directly influenced by the gate voltage, which is in direct connection with output of the first amplifier 231. This is because, although the source voltage $V_n$ of the NMOS transistor M28 is hardly influenced by the DC component, the power noise component, which is the AC component, is transmitted to the source of the NMOS transistor M28 via output of the first amplifier 231, exerting direct influence.

Figure 2B:
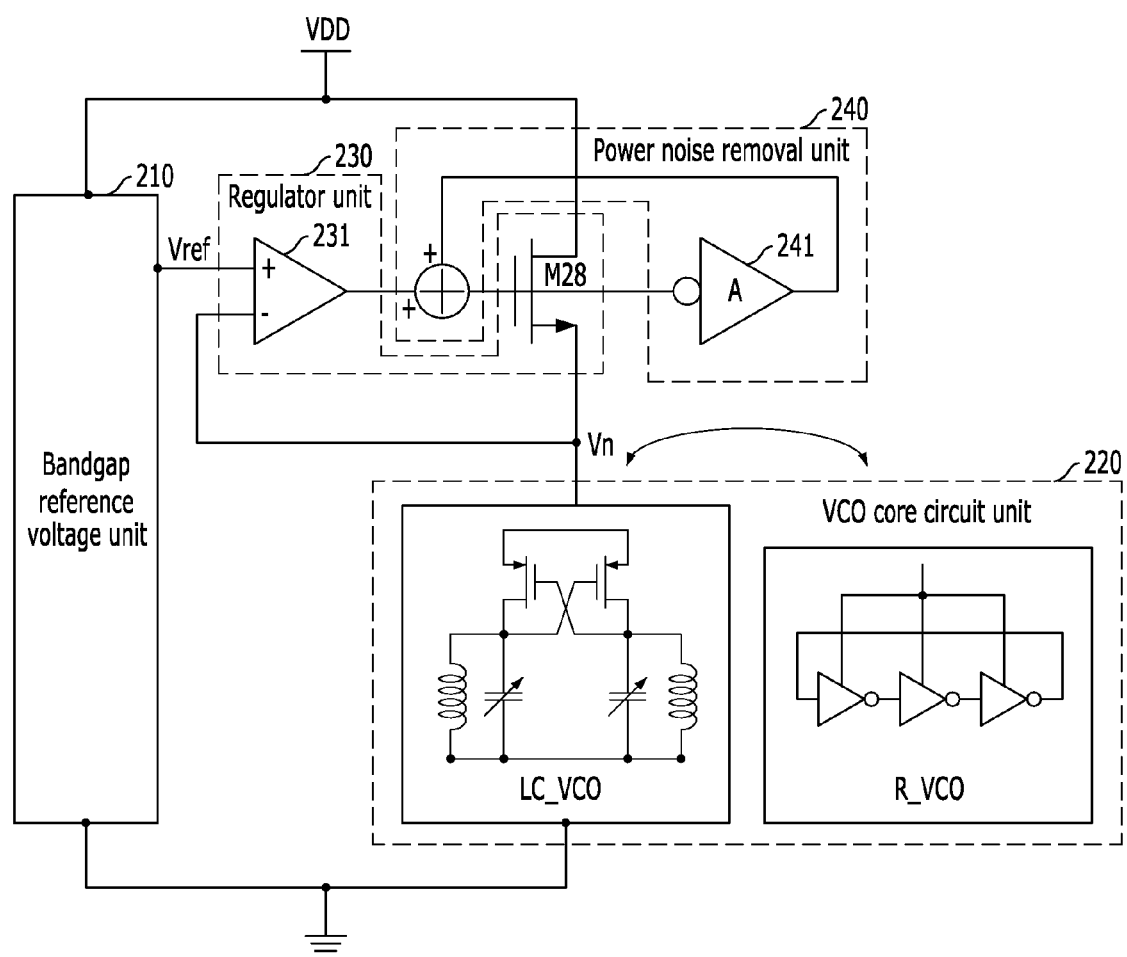
FIG. 2B illustrates a block diagram of a voltage-controlled oscillator robust against power noise in accordance with an embodiment of the present invention.

Therefore, the present invention provides a VCO, as illustrated in FIG. 2B, which is configured to detect noise introduced through the power supply in advance and remove the power noise through a negative feedback loop so that a stable, single oscillation frequency is provided while guaranteeing low phase noise and low jitter characteristics.

FIG. 2B illustrates the construction of a VCO robust against power noise in accordance with an embodiment of the present invention.

Referring to FIG. 2B, the VCO in accordance with an embodiment of the present invention functions as follows: output of the first amplifier 231 is inputted to the second amplifier 241 of the power noise removal unit 240 so as to detect and amplify power noise, and a corresponding signal is added through negative feedback so that, by attenuating the power noise component included in the output of the first amplifier 231, a stable, single oscillation frequency is provided while guaranteeing low phase noise and low jitter characteristics, as will be described in more detail with reference to FIG. 3.

Figure 3:
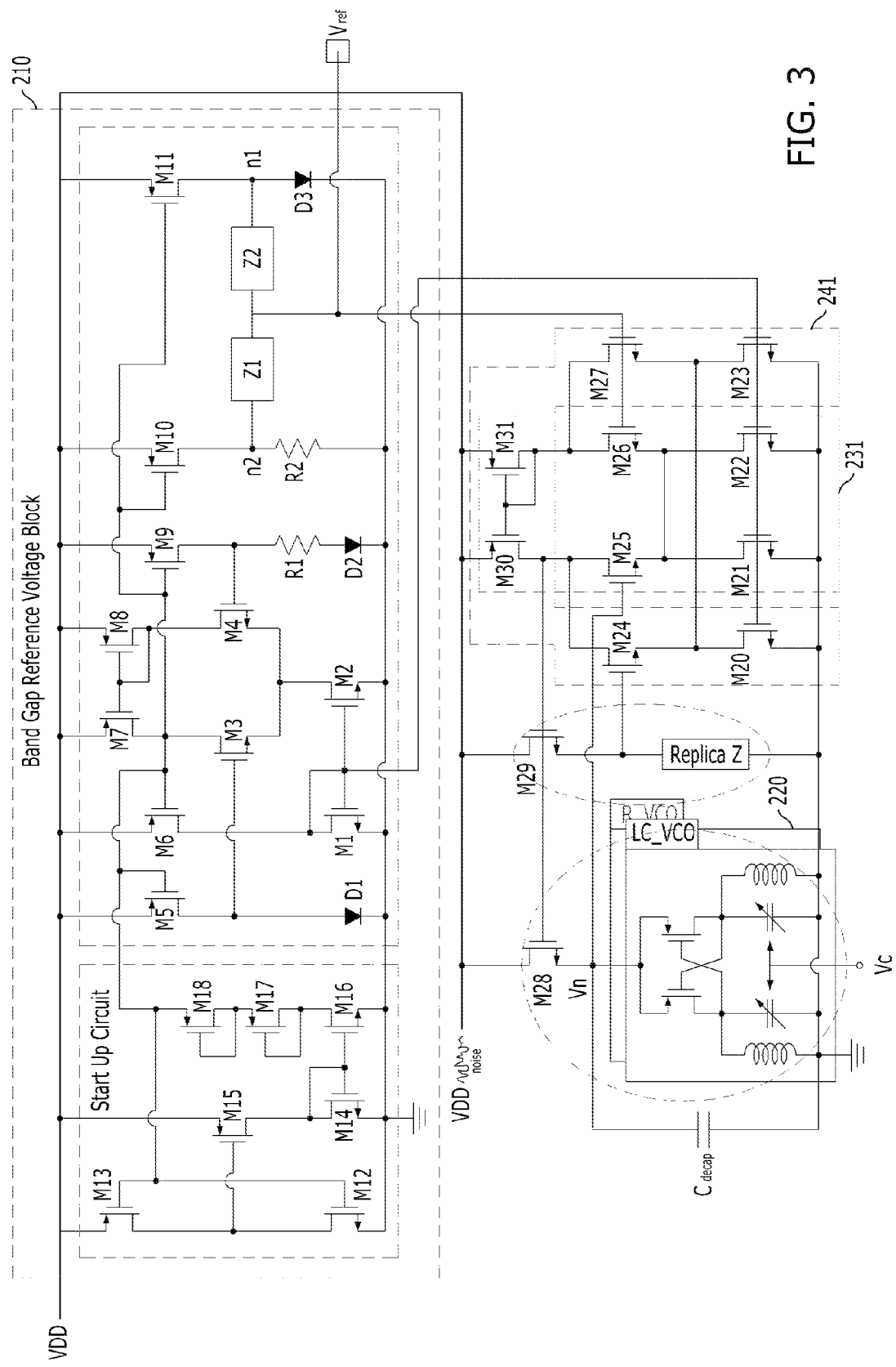
FIG. 3 is a detailed circuit diagram of the voltage-controlled oscillator in accordance with an embodiment of the present invention illustrated in FIG. 2B.

FIG. 3 is a detailed circuit diagram of the VCO in accordance with an embodiment of the present invention illustrated in FIG. 2B.

Referring to FIG. 3, the bandgap reference voltage unit 210 includes a bandgap reference voltage generator configured to generate a reference voltage $V_{ref}$ based on the bandgap theory, and a start-up circuit configured to support the initial operation point for the bias circuit so that the bandgap reference voltage generator can reach a normal condition and provide stable bias within a short period of time, rather than remaining in an abnormal zero condition. The bandgap reference voltage generator includes first to eleventh transistors M1 to M11, first to third diodes D1 to D3, first and second resistors R1 and R2, and first and second devices Z1 and Z2 having predetermined impedance between first and second nodes n1 and n2. The start-up circuit includes twelfth to eighteenth transistors M12 to M18.

The construction of the bandgap reference voltage generator 210 is widely known to those skilled in the art, and detailed description thereof will be omitted herein.

Referring to FIG. 3, the regulator unit 230 includes a first amplifier 231 and a $28^{th}$ transistor M28.

The first amplifier 231 includes $21^{st}$, $22^{nd}$, $25^{th}$, $26^{th}$, $30^{th}$, and $31^{st}$ transistors M21, M22, M25, M26, M30, and M31. The $30^{th}$ and $31^{st}$ transistors M30 and M31 are PMOS type, and are shared with the second amplifier 241 (described later).

Specifically, the reference voltage $V_{ref}$ of the bandgap reference voltage unit 210 is inputted to the positive (+) input terminal of the first amplifier 231. The negative (−) input terminal of the first amplifier 231 forms a closed-circuit loop with the $28^{th}$ transistor M28. More specifically, the gate terminal of the $28^{th}$ transistor M28 is connected with the drain terminal of the $25^{th}$ transistor M25, which belongs to the first amplifier 231. The source terminal of the $28^{th}$ transistor M28 is connected with the gate terminal of the $25^{th}$ transistor M25, which belongs to the first amplifier 231, to form a closed-circuit loop between the $28^{th}$ transistor M28 and the $25^{th}$ transistor M25.

As such, negative feedback occurs in the gate-drain direction of the $25^{th}$ transistor M25 against the gate-source direction of the $28^{th}$ transistor M28 in the closed-circuit loop formed between the $28^{th}$ transistor M28 and the $25^{th}$ transistor M25 so that the source voltage $V_n$ of the $28^{th}$ transistor M28 is adjusted and eventually becomes equal to the reference voltage $V_{ref}$. In other words, the voltage difference between the source voltage $V_n$ of the $28^{th}$ transistor M28 and the reference voltage $V_{ref}$ in the closed-circuit loop is amplified by the first amplifier 231 and is delivered to the gate terminal of the $28^{th}$ transistor M28. The negative feedback keeps the closed-circuit loop functioning until the difference between the source voltage $V_n$ of the $28^{th}$ transistor M28 and the reference voltage $V_{ref}$ disappears (i.e. until both voltages become equal). This means that, due to the negative feedback of the closed-circuit loop, the source voltage $V_n$ of the $28^{th}$ transistor M28 can remain stable as long as phase margin of the loop is guaranteed.

As mentioned above, the source voltage $V_n$ of the $28^{th}$ transistor M28 functions as a virtual power supply for the VCO core circuit unit 220, and remains constant with regard to the DC component regardless of change in temperature characteristics. A decoupling capacitor $C_{decap}$ is used to remain decoupled from the AC component.

The $28^{th}$ transistor M28 and the VCO core circuit unit 220 constitute a source follower, which functions like a buffer, and the gain of which is determined by load impedance of the VCO core circuit unit 220.

The source terminal of the $28^{th}$ transistor M28 is connected with the VCO core circuit unit 220, and the drain terminal thereof is connected with the power supply so that a cascoded state is established. Output of the first amplifier 231 is inputted to the gate terminal of the $28^{th}$ transistor M28.

The first amplifier 231 of the regulator unit 230 is actually under the direct influence of power noise, and in order to remove it, a power noise removal unit 240 is constructed to implement a type of negative feedback in accordance with this embodiment of the present invention. In other words, power noise applied to the source voltage $V_n$ of the $28^{th}$ transistor M28 is subjected to negative feedback so as to compensate for instability occurring in the PLL of the first amplifier 231.

The power noise removal unit 240 includes a second amplifier 241, which consists of $20^{th}$, $23^{rd}$, $24^{th}$, $27^{th}$, $30^{th}$, and $31^{st}$ transistors M20, M23, M24, M27, M30, and M31, a $29^{th}$ transistor M29 configured to detect power noise, and replica Z which is connected with the source terminal of the $29^{th}$ transistor M29, and which has the same impedance value as the VCO core circuit unit 220.

Transistors constituting the first and second amplifiers 231 and 241 correspond to each other. In order to increase the power supply rejection ratio (PSRR), the size of each transistor constituting the second amplifier 241 is determined based on the degree of amplification of the first amplifier 231. Specifically, the degree of amplification of the $21^{st}$ and $22^{nd}$ transistors M21 and M22, which act as the current source of the first amplifier 231, determines the size of the $20^{th}$ and $23^{rd}$ transistors M20 and M23 of the second amplifier 241. Similarly, the degree of amplification of the $25^{th}$ and $26^{th}$ transistors M25 and M26, which are input transistors of the first amplifier 231, determines the size of the $24^{th}$ and $27^{th}$ transistors M24 and M27 of the second amplifier 241. For example, the size of the $20^{th}$ and $23^{rd}$ transistors M20 and M23 is set to be m times the size of the $21^{st}$ and $22^{nd}$ transistors M21 and M22. Similarly, the size of the $24^{th}$ and $27^{th}$ transistors M24 and M27 is set to be n times the size of the $25^{th}$ and $26^{th}$ transistors M25 and M26. In this case, m and n are positive real numbers, and are determined based on the degree of amplification of the first and second amplifiers 231 and 241.

The $29^{th}$ transistor M29 may have the same size as the $28^{th}$ transistor M28.

The power noise signal detected by the $29^{th}$ transistor M29 is delivered from the source follower stage to the PMOS load, i.e. the $30^{th}$ and $31^{st}$ transistors M30 and M31, after being amplified at the negative input terminal of the $24^{th}$ transistor M24 (negative feedback), and is combined with a negative feedback signal from the first amplifier 231. Specifically, the power noise signal undergoes negative feedback through the closed-circuit loop formed between the $24^{th}$ and $29^{th}$ transistors M24 and M29, and is delivered to the PMOS load. In other words, negative feedback signals from the first and second amplifiers 231 and 241 are combined into one through the PMOS load, and the combined signal is inputted to the gate terminal of the $28^{th}$ transistor M28.

In accordance with this embodiment of the present invention, the first amplifier 231 forms a negative feedback loop so that the source voltage $V_n$ of the $28^{th}$ transistor M28 and the reference voltage $V_{ref}$ become identical (i.e. stability is guaranteed), and the second amplifier 241 forms another negative feedback loop to remove power noise existing in the source voltage $V_n$ of the $28^{th}$ transistor M28.

As mentioned above, the tuning voltage $V_n$ applied across the loop filter in the entire frequency synthesizer adjusts the frequency of the VCO. The present invention is also applicable to radio transceivers.

Figure 4A:
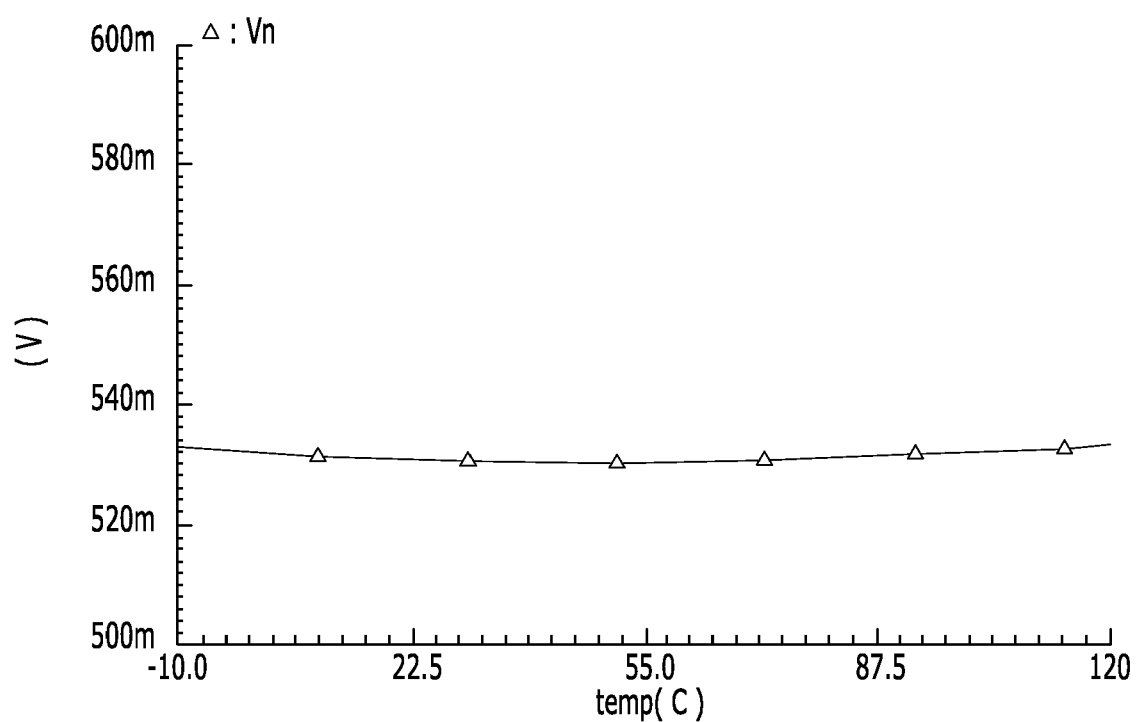
FIG. 4A illustrates the characteristics of a virtual power supply $V_n$, in terms of temperature change, of a voltage-controlled oscillator in accordance with an embodiment of the present invention.
Figure 4B:
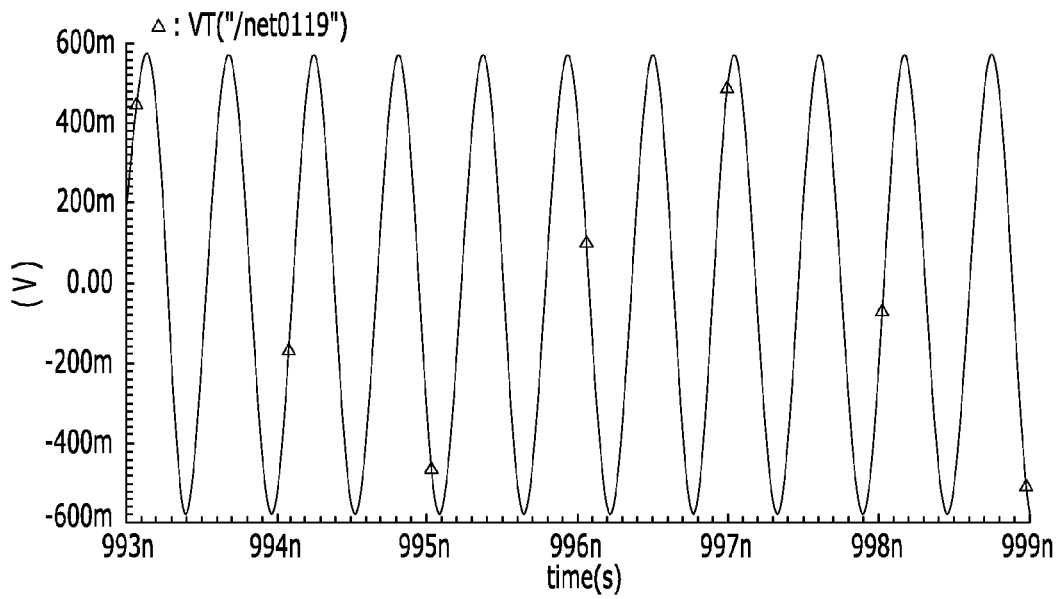
FIGS. 4B and 4C illustrate characteristics of the waveform of an oscillation frequency, in terms of time, from a voltage-controlled oscillator in accordance with an embodiment of the present invention, as well as the converted frequency spectrum, respectively.
Figure 4C:
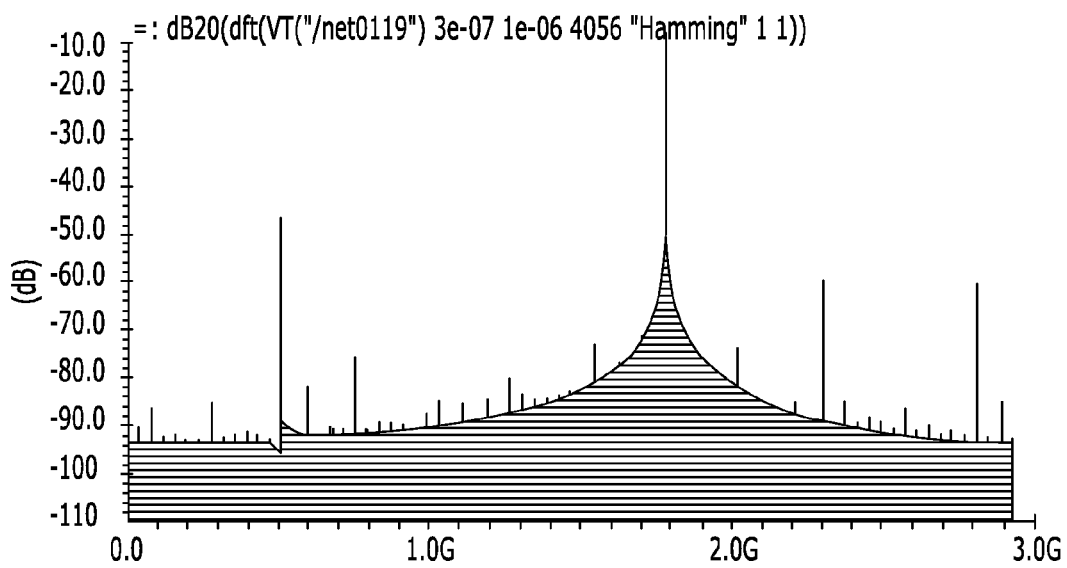

FIG. 4A illustrates the characteristics of a virtual power supply $V_n$, in terms of temperature change, of a VCO in accordance with an embodiment of the present invention. FIGS. 4B and 4C illustrate characteristics of the waveform of an oscillation frequency, in terms of time, from a VCO in accordance with this embodiment of the present invention, as well as the converted frequency spectrum, respectively. FIG.

4D illustrates the power supply rejection ratio of a virtual power supply $V_n$ in a VCO in accordance with this embodiment of the present invention.

Referring to FIG. 4A, the virtual voltage $V_n$ of the VCO core circuit unit 220 exhibits a change of about ±1.5 mV with regard to the reference voltage in the range of −10° C. to 120° C. The bandgap reference voltage unit 210 is a circuit designed for low voltages of at most 1.2V, and generates about 528.5 mV as the reference voltage.

FIGS. 4B and 4C illustrate the waveform of an oscillation frequency, in terms of time, and the converted frequency spectrum, respectively, given as a result of simulation using an LC-VCO circuit as the VCO core circuit unit 220. It is clear from FIG. 4B that, in accordance with this embodiment of the present invention, the oscillation frequency is generally stable, and illustrates characteristics satisfactory enough to be a local frequency.

Figure 4D:
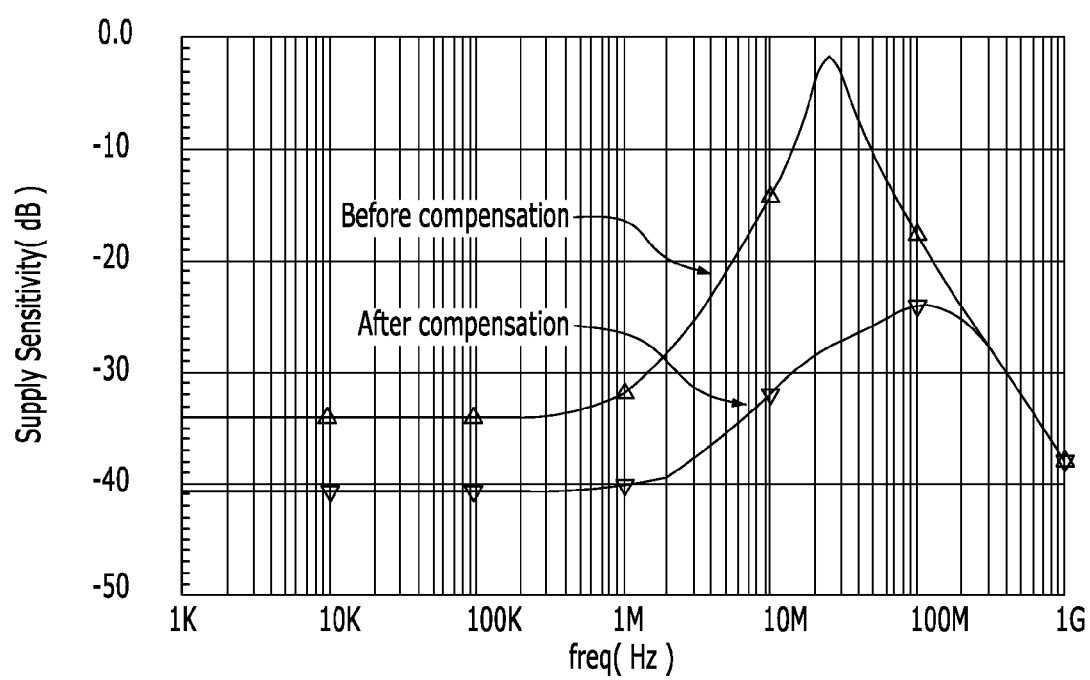
FIG. 4D illustrates the power supply rejection ratio of a virtual power supply $V_n$ in a voltage-controlled oscillator in accordance with an embodiment of the present invention.

FIG. 4D illustrates the power supply rejection ratio (PSRR) in accordance with an embodiment of the present invention. Prior to application of the present invention, i.e. prior to application of the second amplifier 241, which includes the $20^{th}$, $23^{rd}$, $24^{th}$, and $27^{th}$ transistors M20, M23, M24, and M27, and the power noise removal unit 240 including the $29^{th}$ transistor M29, the PSRR is −34 dB for low frequencies at the $V_n$ node. The worst result occurs at 25 MHz, i.e. about half the power noise appears, but the noise decreases at higher frequencies. In contrast, once the power noise removal unit 240 is applied, the initial value is −40.9 dB near the DC, and it increases up to −24 dB at 110 MHz. The PSRR then increases at higher frequencies. The overall power noise attenuation is −24 dB.

In accordance with the exemplary embodiments of the present invention, the VCO is configured to detect noise introduced through the power supply in advance and remove the power noise through a negative feedback loop so that a stable, single oscillation frequency is provided while guaranteeing low phase noise and low jitter characteristics.

In addition, the fact that the mixer is provided with a local frequency with better frequency characteristics (i.e. power noise has been removed) improves the signal recovery capability of the terminal system.

While the present invention has been described with respect to the specific embodiments, it will be apparent to those skilled in the art that various changes and modifications may be made without departing from the spirit and scope of the invention as defined in the following claims.

What is claimed is:

1. A voltage-controlled oscillator (VCO) robust against power noise, comprising:
   a regulating unit configured to serve a stable virtual supply voltage based on a reference voltage to a VCO core circuit;
   a power noise removal unit configured to remove power noise of the virtual supply voltage provided by the regulating unit; and
   the VCO core circuit, wherein
   the regulating unit comprises a first NMOS transistor and a first amplifier,
   wherein the first NMOS transistor has a source terminal connected with the VCO core circuit, a drain terminal connected with a supply voltage, and a gate terminal connected with an output terminal of the first amplifier so that a cascoded state is established; and
   wherein the first amplifier has differential input terminals connected with a source terminal of the first NMOS transistor and a reference voltage respectively, and an output terminal connected to a gate terminal of the first NMOS transistor, where the reference voltage is a positive input of the first amplifier and the source terminal of the first NMOS transistor is a negative input of the first amplifier so that the first NMOS transistor and the first amplifier form a closed-circuit loop.

2. The voltage-controlled oscillator of claim 1, wherein the power noise removal unit comprises a second NMOS transistor and a second amplifier,
   wherein the second NMOS transistor has a source terminal connected with a replica having the same impedance value as the VCO core circuit and a drain terminal connected with the supply voltage, and a gate terminal connected with an output terminal of the second amplifier so that a cascoded state is established; and
   wherein the second amplifier has differential input terminals connected with a source terminal of the second NMOS transistor and the reference voltage respectively, and an output terminal connected to a gate terminal of the second NMOS transistor, where the reference voltage is the positive input terminal of the second amplifier and the source terminal of the second NMOS transistor is the negative input terminal of the second amplifier so that the second NMOS transistor and the second amplifier form a negative closed-circuit loop.

3. The voltage-controlled oscillator of claim 2, wherein the second NMOS transistor is configured to detect the power noise and has the same size as the first NMOS transistor.

4. The voltage-controlled oscillator of claim 2, wherein the first and second NMOS transistors are formed inside a deep n-well and the body of the deep n-well is connected to the source in order to block noise.

5. The voltage-controlled oscillator of claim 2,
   wherein the first amplifier and second amplifier have the same size and gain characteristics, and are commonly connected with a PMOS load configured to combine each negative feedback signal; and
   wherein the first amplifier and the second amplifier are closely disposed to reduce characteristic differences therebetween.

6. The voltage-controlled oscillator of claim 2, wherein the reference voltage is created by a band-gap reference circuit unit comprising a start-up circuit and a band-gap reference voltage generation circuit.

7. An analog radio frequency (RF) block in an electronic apparatus robust against power noise comprising:
   a regulating unit configured to serve a stable virtual supply voltage based on a reference voltage to an analog RF core circuit block;
   a power noise removal unit configured to remove power noise of the virtual supply voltage provided by the regulating unit; and
   the analog RF core circuit block,
   wherein the regulating unit comprises a first NMOS transistor and a first amplifier,
   wherein the first NMOS transistor has a source terminal connected with the analog RF core circuit block, a drain terminal connected with a supply voltage, and a gate terminal connected with an output terminal of the first amplifier so that a cascoded state is established; and
   wherein the first amplifier has differential input terminals connected with a source terminal, of the first NMOS transistor and a reference voltage respectively, and an output terminal connected to a gate terminal of the first NMOS transistor, where the reference voltage is a positive input of the first amplifier and the source terminal of the first NMOS transistor is a negative input of the first amplifier so that the first NMOS transistor and the first amplifier form a negative closed-circuit loop.

8. The analog RF block in the electronic apparatus of claim 7, wherein the power noise removal unit comprise a second NMOS transistor and a second amplifier, wherein the second NMOS transistor has a source terminal connected with a replica having the same impedance value with the analog RF signal processing unit and a drain terminal connected with the supply voltage, and a gate terminal connected with an output of the second amplifier so that a cascoded state is established; and wherein the second amplifier has differential input terminals connected with a source terminal of the second NMOS transistor and the reference voltage respectively, and an output terminal connected to a gate terminal of the second NMOS transistor, where the reference voltage is the positive input of the second amplifier and the source terminal of the second NMOS transistor is the negative input terminal of the second amplifier so that the second NMOS transistor and the second amplifier form a negative closed-circuit loop.

9. The analog RF block in the electronic apparatus of claim 8, wherein the second NMOS transistor is configured to detect the power noise and has the same size with the first NMOS transistor.

10. The analog RF block in the electronic apparatus of claim 8, wherein the first and second NMOS transistors are formed inside a deep n-well and the body of the deep n-well is connected to the source in order to block noise.

11. The analog RF block in the electronic apparatus of claim 8, wherein the first amplifier and second amplifier have the same size and gain characteristics, and are commonly connected with a PMOS load configured to combine each negative feedback signal.

12. The analog RF block in the electronic apparatus of claim 8, wherein the reference voltage is created by a band-gap reference circuit unit comprising a start-up circuit and a band-gap reference voltage generation circuit to overcome temperature variations; and wherein the first amplifier and the second amplifier are closely disposed to reduce characteristic differences therebetween.

* * * * *